US008968643B2

(12) United States Patent
Kobayashi et al.

(10) Patent No.: US 8,968,643 B2
(45) Date of Patent: *Mar. 3, 2015

(54) NI-BASED SINGLE CRYSTAL SUPER ALLOY

(75) Inventors: Toshiharu Kobayashi, Ryugasaki (JP); Yutaka Koizumi, Ryugasaki (JP); Tadaharu Yokokawa, Tsukuba (JP); Hiroshi Harada, Tsukuba (JP); Yasuhiro Aoki, Tokyo (JP); Mikiya Arai, Tokyo (JP); Shoju Masaki, Tokyo (JP)

(73) Assignees: National Institute for Materials Science (JP); IHI Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/900,896

(22) Filed: Oct. 8, 2010

(65) Prior Publication Data

US 2011/0171057 A1 Jul. 14, 2011

Related U.S. Application Data

(63) Continuation-in-part of application No. 10/537,477, filed as application No. PCT/JP03/15619 on Dec. 5, 2003, now abandoned.

(30) Foreign Application Priority Data

Dec. 6, 2002 (JP) ................................ P2002-355756

(51) Int. Cl.
*C22C 19/05* (2006.01)
*C30B 29/52* (2006.01)

(52) U.S. Cl.
CPC .............. *C22C 19/057* (2013.01); *C30B 29/52* (2013.01)
USPC .......................................... 420/444; 148/428

(58) Field of Classification Search
CPC .............................. C30B 29/52; C22C 19/057
USPC .......... 420/442–451, 455, 456, 460; 148/404, 148/410, 426–429
See application file for complete search history.

(56) References Cited

U.S. PATENT DOCUMENTS

| | | | | |
|---|---|---|---|---|
| 4,122,440 A | 10/1978 | Langdon, Jr. et al. | ........ | 340/347 |
| 4,582,548 A | 4/1986 | Harris et al. | ................... | 148/404 |
| 4,643,782 A | 2/1987 | Harris | ........................... | 148/404 |
| 4,719,080 A | 1/1988 | Duhl et al. | ..................... | 420/443 |
| 4,935,072 A | 6/1990 | Nguyen-Dinh | ............... | 148/162 |
| 5,151,249 A | 9/1992 | Austin et al. | .................. | 420/445 |
| 5,366,695 A | 11/1994 | Erickson | ........................ | 420/448 |
| 5,455,120 A | 10/1995 | Walston et al. | ............... | 428/652 |
| 5,482,789 A | 1/1996 | O'Hara et al. | ................ | 428/652 |
| 6,007,645 A | 12/1999 | Cetel et al. | .................... | 148/404 |
| 6,190,471 B1 | 2/2001 | Darolia et al. | ................ | 148/537 |
| 6,444,057 B1 | 9/2002 | Darolia et al. | ................ | 148/428 |
| 6,966,956 B2 | 11/2005 | Koizumi et al. | ............... | 148/428 |
| 2002/0062886 A1 | 5/2002 | Hino et al. | ...................... | 148/562 |
| 2003/0075247 A1 | 4/2003 | Koizumi et al. | ............... | 148/428 |

FOREIGN PATENT DOCUMENTS

| | | |
|---|---|---|
| EP | 0 208 645 | 1/1987 |
| EP | 0 246 082 | 11/1987 |
| EP | 0 434 996 | 7/1991 |
| EP | 0 663 462 | 7/1995 |
| EP | 0 848 071 | 6/1998 |
| EP | 0 971 041 | 1/2000 |
| EP | 1 184 473 | 3/2002 |
| FR | 2 780 983 | 1/2000 |
| JP | 53-110338 | 9/1978 |
| JP | 60-087596 | 5/1985 |
| JP | 61-284545 | 12/1986 |
| JP | 62-267440 | 11/1987 |
| JP | 03-192876 | 8/1991 |
| JP | 07-274171 | 10/1995 |
| JP | 10-195565 | 7/1998 |
| JP | 10-330872 | 12/1998 |
| JP | 11-256258 | 9/1999 |
| JP | 11-310839 | 11/1999 |
| JP | 2000-034531 | 2/2000 |
| JP | 2000-239771 | 9/2000 |

OTHER PUBLICATIONS

Japanese Office Action dated May 24, 2005 in Japanese Patent Application No. 2002-143572 (English Translation)—disclosed in related U.S. Appl. No. 10/899,167, now U.S. Patent No. 6,966,956.
Hino et al., (2000), "Development of High Strengthened Ni-Based Single Crystal Super Alloy," Proceedings of Autumn Meeting of Gas Turbine Society of Japan, vol. 15:13-18 (English Abstract)—disclosed in related U.S. Appl. No. 10/899,167, now U.S. Patent No. 6,966,956.
Koizumi et al., (2001), "High Temperature Characteristics of Fourth-Generation Single Crystal Super Alloy," Proceedings of Autumn Meeting of Gas Turbine Society of Japan, vol. 16:81-86 (English Abstract)—disclosed in related U.S. Appl. No. 10/899,167, now U.S. Patent No. 6,966,956.
European Search Report for European Patent Application No. EP 02 25 3782 dated Aug. 29, 2002 (English)—disclosed in related U.S. Appl. No. 10/159,202.

(Continued)

*Primary Examiner* — Roy King
*Assistant Examiner* — Caitlin Kiechle
(74) *Attorney, Agent, or Firm* — Ostrolenk Faber LLP

(57) ABSTRACT

The object of the present invention is to provide an Ni-based single crystal super alloy capable of improving strength by preventing precipitation of a TCP phase at high temperatures. This object is achieved by an Ni-based single crystal super alloy having a composition comprising 5.0-7.0 wt % of Al, 4.0-10.0 wt % of Ta, 1.1-4.5 wt % of Mo, 4.0-10.0 wt % of W, 3.1-8.0 wt % of Re, 0-0.50 wt % of Hf, 2.0-5.0 wt % of Cr, 0-9.9 wt % of Co and 4.1-14.0 wt % of Ru in terms of its weight ratio, with the remainder consisting of Ni and unavoidable impurities. Furthermore, in this Ni-based single crystal super alloy, when lattice constant of matrix is taken to be a1 and lattice constant of precipitation phase is taken to be a2, $a2 \leq 0.999 a1$.

12 Claims, 2 Drawing Sheets

(56) References Cited

OTHER PUBLICATIONS

European Communication for European Patent Application No. EP 02 253 782.3 dated Jul. 14, 2003 (English)—disclosed in related U.S. Appl. No. 10/159,202.
Supplementary European Search Report for European Patent Application No. EP 03 77 7308 dated Oct. 5, 2006 (English)—disclosed in parent U.S. Appl. No. 10/537,477.
Japanese Office Action dated May 24, 2005 in Japanese Patent Application No. 2002-143572 (Japanese)—disclosed in related U.S. Appl. No. 10/899,167, now U.S. Patent No. 6,966,956.
Japanese Office Action dated Jun. 14, 2005 in Japanese Patent Application No. 2004-558425 (English)—disclosed in parent U.S. Appl. No. 10/537,477.
International Search Report dated Mar. 16, 2004 in related International Application No. PCT/JP03/15619 (English).
U.S. Office Action dated Sep. 4, 2003 in related U.S. Appl. No. 10/159,202.
U.S. Office Action dated Apr. 10, 2008 in parent U.S. Appl. No. 10/537,477.
U.S. Advisory Action dated Oct. 10, 2008 in parent U.S. Appl. No. 10/537,477.
U.S. Office Action dated Jun. 2, 2009 in parent U.S. Appl. No. 10/537,477.
U.S. Office Action dated Sep. 19, 2007 in parent U.S. Appl. No. 10/537,477.
U.S. Office Action dated Apr. 9, 2010 in parent U.S. Appl. No. 10/537,477.
C. Magazine, Aug. 2001, p. 111-116 "Image Compression Algorithm 2 Entropy Coding 'Shanon-Fano Coding and Haffman Coding'" (In Japanese—English abstract attached).
C. Magazine, Sep. 2001, p. 95-100 "Image Compression Algorithm 3 'Elias Coding and Arithmetic Coding'" (In Japanese—English abstract attached).
C. Magazine Jul. 2002 p. 13-35 "Data Compression, from the fundamentals to applications Algorithm" (In Japanese—English abstract attached).
Yokokawa et al., "Partitioning behavior of platinum group metals on the $\gamma$ and $\gamma'$ phases of Ni-base superalloys at high temperatures" Scripta Materialia, 49 (2003), pp. 1041-1046.
Zhang et al., "Strengthening by $\gamma/\gamma'$ Interfacial Dislocation Networks in TMS-162—Toward a Fifth-Generation Single Crystal Superalloy," Metallurgical and Materials Transactions, 35A (Jun. 2004), pp. 1911-1914.
Zhang et al., "The effect of lattice misfit on the dislocation motion in superalloys during high-temperature low-stress creep," Acta Materialia, 53 (2005), pp. 4623-4633.

NI-BASED SINGLE CRYSTAL SUPER ALLOY

CROSS-REFERENCE TO RELATED APPLICATIONS

This application is a continuation-in-part of U.S. patent application Ser. No. 10/537,477, filed Jun. 3, 2005, now abandoned, which is a 35 U.S.C. §371 national phase conversion of PCT/JP2003/015619, filed Dec. 5, 2003, which claims priority to Japanese Patent Application No. 2002-355756, filed Dec. 6, 2002, the contents of which are incorporated herein by reference.

TECHNICAL FIELD

The present invention relates to a Ni-based single crystal super alloy, and more particularly, to a technology employed for improving the creep characteristics of Ni-based single crystal super alloy.

BACKGROUND ART

An example of the typical composition of Ni-based single crystal super alloy developed for use as a material for moving and stationary blades subject to high temperatures such as those in aircraft and gas turbines is shown in Table 1.

TABLE 1

| Alloy name | Elements (wt %) | | | | | | | | | | | | |
|---|---|---|---|---|---|---|---|---|---|---|---|---|---|
| | Al | Ti | Ta | Nb | Mo | W | Re | C | Zr | Hf | Cr | Co | Ru | Ni |
| CMSX-2 | 6.0 | 1.0 | 6.0 | — | 1.0 | 8.0 | — | — | — | — | 8.0 | 5.0 | — | Rem |
| CMSX-4 | 5.6 | 1.0 | 6.5 | — | 0.6 | 6.0 | 3.0 | — | — | — | 6.5 | 9.0 | — | Rem |
| Rene'N6 | 6.0 | — | 7.0 | 0.3 | 1.0 | 6.0 | 5.0 | — | — | 0.2 | 4.0 | 13.0 | — | Rem |
| CMSX-10K | 5.7 | 0.3 | 8.4 | 0.1 | 0.4 | 5.5 | 6.3 | — | — | 0.03 | 2.3 | 3.3 | — | Rem |
| 3B | 5.7 | 0.5 | 8.0 | — | — | 5.5 | 6.0 | 0.05 | — | 0.15 | 5.0 | 12.5 | 3.0 | Rem |

In the above-mentioned Ni-based single crystal super alloys, after performing solution treatment at a prescribed temperature, aging treatment is performed to obtain an Ni-based single crystal super alloy. This alloy is referred to as a so-called precipitation hardened alloy, and has a form in which the precipitation phase in the form of a γ' phase is precipitated in a matrix in the form of a γ phase.

Among the alloys listed in Table 1, CMSX-2 (Cannon-Muskegon, U.S. Pat. No. 4,582,548) is a first-generation alloy, CMSX-4 (Cannon-Muskegon, U.S. Pat. No. 4,643, 782) is a second-generation alloy, Rene'N6 (General Electric, U.S. Pat. No. 5,455,120) and CMSX-10K (Canon-Muskegon, U.S. Pat. No. 5,366,695) are third-generation alloys, and 3B (General Electric, U.S. Pat. No. 5,151,249) is a fourth-generation alloy.

Although the above-mentioned CMSX-2, which is a first-generation alloy, and CMSX-4, which is a second-generation alloy, have comparable creep strength at low temperatures, since a large amount of the eutectic γ' phase remains following high-temperature solution treatment, their creep strength is inferior to third-generation alloys.

In addition, although the third-generation alloys of Rene'N6 and CMSX-10 are alloys designed to have improved creep strength at high temperatures in comparison with second-generation alloys, since the composite ratio of Re (5 wt % or more) exceeds the amount of Re that dissolves into the matrix (γ phase), the excess Re compounds with other elements and as a result, a so-called TCP (topologically close packed) phase precipitates at high temperatures causing the problem of decreased creep strength.

In addition, making the lattice constant of the precipitation phase (γ' phase) slightly smaller than the lattice constant of the matrix (γ phase) is effective in improving the creep strength of Ni-based single crystal super alloys. However, since the lattice constant of each phase fluctuates greatly fluctuated according to the composite ratios of the composite elements of the alloy, it is difficult to make fine adjustments in the lattice constant and as a result, there is the problem of considerable difficulty in improving creep strength.

In consideration of the above circumstances, the object of the present invention is to provide a Ni-based single crystal super alloy that makes it possible to improve strength by preventing precipitation of the TCP phase at high temperatures.

DISCLOSURE OF INVENTION

The following constitution is employed in the present invention in order to achieve the above object.

The Ni-based single crystal super alloy of the present invention is characterized by having a composition comprising 5.0-7.0 wt % of Al, 4.0-10.0 wt % of Ta, 1.1-4.5 wt % of Mo, 4.0-10.0 wt % of W, 3.1-8.0 wt % of Re, 0-0.50 wt % of Hf 2.0-5.0 wt % of Cr, 0-9.9 wt % of Co and 4.1-14.0 wt % of Ru in terms of its weight ratio, with the remainder consisting of Ni and unavoidable impurities.

Furthermore, the Ni-based single crystal super alloy of the present invention is characterized by $a2 \leq 0.999 a1$ when the lattice constant of the matrix is taken to be $a1$ and the lattice constant of the precipitation phase is taken to be $a2$ in the Ni-based single crystal super alloys previously described.

According to the above Ni-based single crystal super alloy, precipitation of the TCP phase, which causes a decrease in creep strength, during use at high temperatures is inhibited by the addition of Ru. In addition, by setting the composite ratios of other composite elements within their optimum ranges, the lattice constant of the matrix (γ phase) and the lattice constant of the precipitation phase (γ' phase) can be made to have optimum values. Consequently, strength at high temperatures can be enhanced. Furthermore, since the composition of Ru is 4.1-14.0 wt %, precipitation of the TCP phase, which causes a decrease in creep strength, during use at high temperatures, is inhibited.

Furthermore, according to this Ni-based single crystal super alloy, the relationship between $a1$ and $a2$ is such that $a2 \leq 0.999 a1$ when the lattice constant of the matrix is taken to be $a1$ and the lattice constant of the precipitation phase is taken to be $a2$, and since the lattice constant $a2$ of the precipitation phase is −0.1% or less of the lattice constant $a1$ of the matrix, the precipitation phase that precipitates in the matrix precipitates so as to extend continuously in the direction perpendicular to the direction of the load. As a result, strength at high temperatures can be enhanced without dislocation defects moving within the alloy structure under stress.

In addition, the above-described Ni-based single crystal super alloy of the present invention is preferably having a composition comprising 5.0-7.0 wt % of Al, 4.0-6.0 wt % of Ta, 2.1-4.5 wt % of Mo, 4.0-10.0 wt % of W, 3.1-8.0 wt % of Re, 0-0.50 wt % of Hf, 2.0-5.0 wt % of Cr, 0-9.9 wt % of Co, and 4.1-14.0 wt % of Ru in terms of weight ratio, with the remainder consisting of Ni and unavoidable impurities.

In addition, the above-described Ni-based single crystal super alloy of the present invention is preferably having a composition comprising 5.0-7.0 wt % of Al, 4.0-6.0 wt % of Ta, 2.8-4.5 wt % of Mo, 4.0-10.0 wt % of W, 3.1-8.0 wt % of Re, 0-0.50 wt % of Hf, 2.0-5.0 wt % of Cr, 0-9.9 wt % of Co and 4.1-14.0 wt % of Ru in terms of weight ratio, with the remainder consisting of Ni and unavoidable impurities.

In addition, the above-described Ni-based single crystal super alloy of the present invention is preferably having a composition comprising 5.9 wt % of Al, 5.9 wt % of Ta, 3.9 wt % of Mo, 5.9 wt % of W, 4.9 wt % of Re, 0.10 wt % of Hf 2.9 wt % of Cr, 5.9 wt % of Co and 5.0 wt % of Ru in terms of weight ratio, with the remainder consisting of Ni and unavoidable impurities, in the Ni-based single crystal super alloys previously described.

According to an Ni-based single crystal super alloy having this composition, the creep endurance temperature at 137 MPa and 1000 hours can be made to be 1344 K (1071° C.).

In addition, the above-described Ni-based single crystal super alloy of the present invention is preferably having a composition comprising 5.8 wt % of Co, 2.9 wt % of Cr, 3.1 wt % of Mo, 5.8 wt % of W, 5.8 wt % of Al, 5.6 wt % of Ta, 5.0 wt % of Ru, 4.9 wt % of Re and 0.10 wt % of Hf in terms of weight ratio, with the remainder consisting of Ni and unavoidable impurities, in the Ni-based single crystal super alloys previously described.

According to an Ni-based single crystal super alloy having this composition, the creep endurance temperature at 137 MPa and 1000 hours can be made to be 1366 K (1093° C.).

In addition, the above-described Ni-based single crystal super alloy of the present invention is preferably having a composition comprising 5.8 wt % of Co, 2.9 wt % of Cr, 3.9 wt % of Mo, 5.8 wt % of W, 5.8 wt % of Al, 5.8 wt % (5.82 wt %) or 5.6 wt % of Ta, 6.0 wt % of Ru, 4.9 wt % of, Re and 0.10 wt % of Hf in terms of weight ratio, with the remainder consisting of Ni and unavoidable impurities, in the Ni-based single crystal super alloys previously described.

According to an Ni-based single crystal super alloy having this composition, the creep endurance temperature at 137 MPa and 1000 hours can be made to be 1375 K (1102° C.) or 1379 K (1106° C.).

Furthermore, 0-2.0 wt % of Ti in terms of weight ratio can be included in the Ni-based single crystal super alloys previously described.

Furthermore, 0-4.0 wt % of Nb in terms of weight ratio can be included in the Ni-based single crystal super alloys previously described.

Furthermore, at least one of elements selected from B, C, Si, Y, La, Ce, V and Zr can be included in the Ni-based single crystal super alloys previously described.

In this case, it is preferable that 0.05 wt % or less of B, 0.15 wt % or less of C, 0.1 wt % or less of Si, 0.1 wt % or less of Y, 0.1 wt % or less of La, 0.1 wt % or less of Ce, 1 wt % or less of V and 0.1 wt % or less of Zr in terms of weight ratio are included in the alloys.

Furthermore, the above described Ni-based single crystal super alloy is more preferably having a composition comprising 5.0-7.0 wt % of Al, 4.0-10.0 wt % of Ta, 1.1-4.5 wt % of Mo, 4.0-10.0 wt % of W, 3.1-8.0 wt % of Re, 0-0.50 wt % of Hf, 2.0-5.0 wt % of Cr, 0-9.9 wt % of Co, 10.0-14.0 wt % of Ru, 4.0 wt % or less of Nb, 2.0 wt % or less of Ti, 0.05 wt % or less of B, 0.15 wt % or less of C, 0.1 wt % or less of Si, 0.1 wt % or less of Y, 0.1 wt % or less of La, 0.1 wt % or less of Ce, 1 wt % or less of V and 0.1 wt % or less of Zr.

Furthermore, the above described Ni-based single crystal super alloy is more preferably having a composition comprising 5.8-7.0 wt % of Al, 4.0-5.6 wt % of Ta, 3.34.5 wt % of Mo, 4.0-10.0 wt % of W, 3.1-8.0 wt % of Re, 0-0.50 wt % of Hf, 2.9-4.3 wt % of Cr, 0-9.9 wt % of Co, 4.1-14.0 wt % of Ru, 4.0 wt % or less of Nb, 2.0 wt % or less of Ti, 0.05 wt % or less of B, 0.15 wt % or less of C, 0.1 wt % or less of Si, 0.1 wt % or less of Y, 0.1 wt % or less of La, 0.1 wt % or less of Ce, 1 wt % or less of V and 0.1 wt % or less of Zr.

Furthermore, the above described Ni-based single crystal super alloy is more preferably having a composition comprising 5.0-7.0 wt % of Al, 4.0-10.0 wt % of Ta, 1.1-4.5 wt % of Mo, 4.0-10.0 wt % of W, 3.1-8.0 wt % of Re, 0-0.50 wt % of Hf, 2.9-5.0 wt % of Cr, 0-9.9 wt % of Co, 6.5-14.0 wt % of Ru, 4.0 wt % or less of Nb, 2.0 wt % or less of Ti, 0.05 wt % or less of B, 0.15 wt % or less of C, 0.1 wt % or less of Si, 0.1 wt % or less of Y, 0.1 wt % or less of La, 0.1 wt % or less of Ce, 1 wt % or less of V and 0.1 wt % or less of Zr.

Furthermore, the above described Ni-based single crystal super alloy is more preferably having a composition comprising 5.0-7.0 wt % of Al, 4.0-6.0 wt % of Ta, 3.34.5 wt % of Mo, 4.0-10.0 wt % of W, 3.1-8.0 wt % of Re, 0-0.50 wt % of Hf, 2.0-5.0 wt % of Cr, 0-9.9 wt % of Co, 4.1-14.0 wt % of Ru, 4.0 wt % or less of Nb, 2.0 wt % or less of Ti, 0.05 wt % or less of B, 0.15 wt % or less of C, 0.1 wt % or less of Si, 0.1 wt % or less of Y, 0.1 wt % or less of La, 0.1 wt % or less of Ce, 1 wt % or less of V and 0.1 wt % or less of Zr.

Furthermore, the above described Ni-based single crystal super alloy is more preferably having a composition comprising 5.0-7.0 wt % of Al, 4.0-5.6 wt % of Ta, 3.3-4.5 wt % of Mo, 4.0-10.0 wt % of W, 3.1-8.0 wt % of Re, 0-0.50 wt % of Hf, 2.0-5.0 wt % of Cr, 0-9.9 wt % of Co, 4.1-14.0 wt % of Ru, 4.0 wt % or less of Nb, 2.0 wt % or less of Ti, 0.05 wt % or less of B, 0.15 wt % or less of C, 0.1 wt % or less of Si, 0.1 wt % or less of Y, 0.1 wt % or less of La, 0.1 wt % or less of Ce, 1 wt % or less of V and 0.1 wt % or less of Zr.

Furthermore, the above described Ni-based single crystal super alloy is more preferably having a composition comprising 5.0-7.0 wt % of Al, 4.0-10.0 wt % of Ta, 3.1-4.5 wt % of Mo, 4.0-10.0 wt % of W, 3.1-8.0 wt % of Re, 0-0.50 wt % of Hf, 2.0-5.0 wt % of Cr, 0-9.9 wt % of Co, 4.1-14.0 wt % of Ru, 4.0 wt % or less of Nb, 0.05 wt % or less of B, 0.15 wt % or less of C, 0.1 wt % or less of Si, 0.1 wt % or less of Y, 0.1 wt % or less of La, 0.1 wt % or less of Ce, 1 wt % or less of V and 0.1 wt % or less of Zr.

Furthermore, the above described Ni-based single crystal super alloy is more preferably having a composition comprising 5.8-7.0 wt % of Al, 4.0-10.0 wt % of Ta, 3.1-4.5 wt % of Mo, 4.0-10.0 wt % of W, 3.1-8.0 wt % of Re, 0-0.50 wt % of Hf, 2.0-5.0 wt % of Cr, 0-9.9 wt % of Co, 4.1-14.0 wt % of Ru, 4.0 wt % or less of Nb, 2.0 wt % or less of Ti, 0.05 wt % or less of B, 0.15 wt % or less of C, 0.1 wt % or less of Si, 0.1 wt % or less of Y, 0.1 wt % or less of La, 0.1 wt % or less of Ce, 1 wt % or less of V and 0.1 wt % or less of Zr.

Furthermore, the above described Ni-based single crystal super alloy is more preferably having a composition comprising 5.0-7.0 wt % of Al, 4.0-10.0 wt % of Ta, 3.1-4.5 wt % of Mo, 4.0-10.0 wt % of W, 3.1-8.0 wt % of Re, 0-0.50 wt % of Hf, 2.9-4.3 wt % of Cr, 0-9.9 wt % of Co, 4.1-14.0 wt % of Ru, 4.0 wt % or less of Nb, 2.0 wt % or less of Ti, 0.05 wt % or less of B, 0.15 wt % or less of C, 0.1 wt % or less of Si, 0.1 wt % or less of Y, 0.1 wt % or less of La, 0.1 wt % or less of Ce, 1 wt % or less of V and 0.1 wt % or less of Zr.

In addition, the above described Ni-based single crystal super alloy is more preferably having a composition comprising 5.0-7.0 wt % of Al, 4.0-10.0 wt % of Ta+Nb+Ti, 3.3-4.5 wt % of Mo, 4.0-10.0 wt % of W, 3.1-8.0 wt % of Re, 0-0.50 wt % of Hf, 2.0-5.0 wt % of Cr, 0-9.9 wt % of Co, 4.1-14.0 wt % of Ru, 0.05 wt % or less of B, 0.15 wt % or less of C, 0.1 wt % or less of Si, 0.1 wt % or less of Y, 0.1 wt % or less of La, 0.1 wt % or less of Ce, 1 wt % or less of V and 0.1 wt % or less of Zr.

It is more preferable that the lattice constant of the crystals of the precipitation phase a2 is 0.9965 or less of the lattice constant of the crystals of the matrix a1.

Furthermore, the Ni-based single crystal super alloy of the present invention is characterized by comprising the feature that the dislocation space of the alloy is 40 nm or less.

BEST MODE FOR CARRYING OUT THE INVENTION

Figure 1:
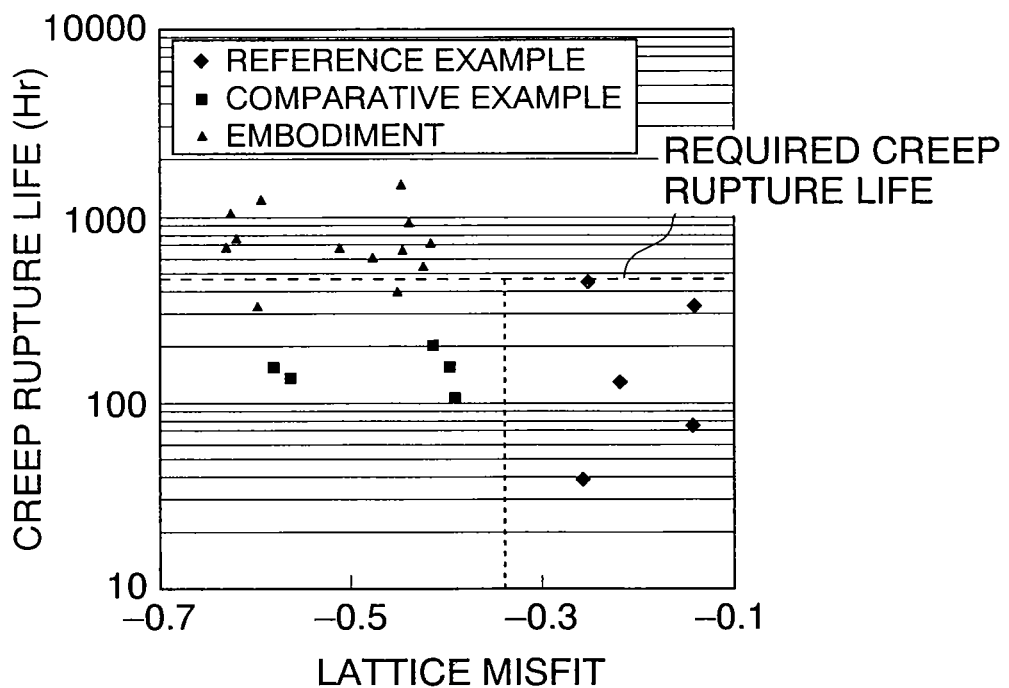
FIG. 1 is a diagram showing a relationship between change of lattice misfit of the alloy and creep rupture life of the alloy.

The following provides a detailed explanation for carrying out the present invention.

The Ni-based single crystal super alloy of the present invention is an alloy comprised of Al, Ta, Mo, W, Re, Hf Cr, Co, Ru, Ni (remainder) and unavoidable impurities.

The above Ni-based single crystal super alloy is an alloy having a composition comprising 5.0-7.0 wt % of Al, 4.0-10.0 wt % of Ta, 1.1-4.5 wt % of Mo, 4.0-10.0 wt % of W, 3.1-8.0 wt % of Re, 0-0.50 wt % of Hf, 2.0-5.0 wt % of Cr, 0-9.9 wt % of Co and 4.1-14.0 wt % of Ru, with the remainder consisting of Ni and unavoidable impurities.

In addition, the above Ni-based single crystal super alloy is an alloy having a composition comprising 5.0-7.0 wt % of Al, 4.0-6.0 wt % of Ta, 2.1-4.5 wt % of Mo, 4.0-10.0 wt % of W, 3.1-8.0 wt % of Re, 0-0.50 wt % of Hf, 2.0-5.0 wt % of Cr, 0-9.9 wt % of Co and 4.1-14.0 wt % of Ru, with the remainder consisting of Ni and unavoidable impurities.

Moreover, the above Ni-based single crystal super alloy is an alloy having a composition comprising 5.0-7.0 wt % of Al, 4.0-6.0 wt % of Ta, 2.8-4.5 wt % of Mo, 4.0-10.0 wt % of W, 3.1-8.0 wt % of Re, 0-0.50 wt % of Hf 2.0-5.0 wt % of Cr, 0-9.9 wt % of Co and 4.1-14.0 wt % of Ru, with the remainder consisting of Ni and unavoidable impurities.

All of the above alloys have an austenite phase in the form of a γ phase (matrix) and an intermediate regular phase in the form of a γ' phase (precipitation phase) that is dispersed and precipitated in the matrix. The γ' phase is mainly composed of an intermetallic compound represented by $Ni_3Al$, and the strength of the Ni-based single crystal super alloy at high temperatures is improved by this γ' phase.

Cr is an element that has superior oxidation resistance and improves the high-temperature corrosion resistance of the Ni-based single crystal super alloy. The composite ratio of Cr is preferably within the range of 2.0 wt % or more to 5.0 wt % or less, and more preferably 2.9 wt %. This ratio is more preferably within the range of 2.9 wt % or more to 5.0 wt % or less, more preferably within the range of 2.9 wt % or more to 4.3 wt % or less, and most preferably 2.9 wt %. If the composite ratio of Cr is less than 2.0 wt %, the desired high-temperature corrosion resistance cannot be secured, thereby making this undesirable. If the composite ratio of Cr exceeds 5.0 wt %, in addition to precipitation of the γ' phase being inhibited, harmful phases such as a σ phase or μ phase form that cause a decrease in strength at high temperatures, thereby making this undesirable.

Mo is an element that is distributed in the γ phase rather than the γ' phase and increases aftermentioned lattice misfit in negative sense by increasing lattice constant of the γ phase. In general, when the lattice misfit increases in negative sense, aftermentioned dislocation networks which exist in interfaces between γ and γ' phases become narrower. As a result, dislocations in the alloy are entangled during creep and stuck each other, and consequently, deformation of the alloy at high temperatures is prohibited and strength at high temperatures is improved. However, if Mo is insufficiently added, the above-described effects may decreases, and therefore, at least 1.1 wt % or more of Mo is added. Furthermore, when particularly high creep strength must be obtained, 2.1 wt % or more, and more preferably, 2.8 wt % or more of Mo is added. For example, if the composition of Mo is doubled without changing the composition of the composite elements that compose the alloy, creep rupture life at 900° C., 1000° C. and 1100° C. increases approximately twice. However, since oxidation resistance of the alloy is decreased in accordance with the added amount of Mo, under the situation in which oxidation resistance of the alloy determines the life of an article made of the alloy, the life of the article can be prolonged by decreasing the composition of Mo to 1.1 wt % although strength at high temperatures decreases. On the other hand, if Mo is excessively added, a strain which exists in interfaces between γ and γ' phases becomes larger, and as a result, undesirable changes in the microstructure of the alloy such as the deformation of the γ' phase during the production procedures of the alloy may be caused. Therefore, it is preferable that 4.5 wt % or less of Mo is added.

If the composite ratio of Mo exceeds 4.5 wt %, strength at high temperatures decreases, and corrosion resistance at high temperatures also decreases, thereby making this undesirable.

W improves strength at high temperatures due to the actions of solution hardening and precipitation hardening in the presence of Mo and Ta as previously mentioned. The composite ratio of W is preferably within the range of 4.0 wt % or more to 10.0 wt % or less, and most preferably 5.9 wt % or 5.8 wt %. If the composite ratio of W is less than 4.0 wt %, strength at high temperatures cannot be maintained at the desired level, thereby making this undesirable. If the composite ratio of W exceeds 10.0 wt %, high-temperature corrosion resistance decreases, thereby making this undesirable.

Ta improves strength at high temperatures due to the actions of solution hardening and precipitation hardening in the presence of Mo and Was previously mentioned, and also improves strength at high temperatures as a result of a portion of the Ta undergoing precipitation hardening relative to the γ' phase. The composite ratio of Ta is preferably within the range of 4.0 wt % or more to 10.0 wt % or less, more preferably within the range of 4.0 wt % or more to 6.0 wt % or less. This ratio is more preferably within the range of 4.0 wt % or more to 5.6 wt % or less, and most preferably 5.6 wt % or 5.82 wt %. If the composite ratio of Ta is less than 4.0 wt %, strength at high temperatures cannot be maintained at the desired level, thereby making this undesirable. If the composite ratio of Ta exceeds 10.0 wt %, the σ phase and μ phase form that cause a decrease in strength at high temperatures, thereby making this undesirable.

Al improves strength at high temperatures by compounding with Ni to form an intermetallic compound represented by Ni$_3$Al, which composes the γ' phase that finely and uniformly disperses and precipitates in the matrix, at a ratio of 60-70% in terms of volume percent. The composite ratio of Al is preferably within the range of 5.0 wt % or more to 7.0 wt % or less. This ratio is more preferably within the range of 5.8 wt % or more to 7.0 wt % or less, and most preferably 5.9 wt % or 5.8 wt %. If the composite ratio of Al is less than 5.0 wt %, the precipitated amount of γ' (phase becomes insufficient, and strength at high temperatures cannot be maintained at the desired level, thereby making this undesirable. If the composite ratio of Al exceeds 7.0 wt %, a large amount of a coarse γ phase referred to as the eutectic γ' phase is formed, and this eutectic γ' phase prevents solution treatment and makes it impossible to maintain strength at high temperatures at a high level, thereby making this undesirable.

Hf is an element that segregates at the grain boundary and improves strength at high temperatures by strengthening the grain boundary as a result of being segregated at the grain boundary between the γ phase and γ' phase. The composite ratio of Hf is preferably within the range of 0.01 wt % or more to 0.50 wt % or less, and most preferably 0.10 wt %. If the composite ratio of Hf is less than 0.01 wt %, the precipitated amount of the γ' phase becomes insufficient and strength at high temperatures cannot be maintained at the desired level, thereby making this undesirable. However, the composite ratio of Hf may be within the range of 0 wt % or more to less than 0.01 wt %, if necessary. Furthermore, if the composite ratio of Hf exceeds 0.50 wt %, local melting is induced which results in the risk of decreased strength at high temperatures, thereby making this undesirable.

Co improves strength at high temperatures by increasing the solution limit at high temperatures relative to the matrix such as Al and Ta, and dispersing and precipitating a fine γ' phase by heat treatment. The composite ratio of Co is preferably within the range of 0.1 wt % or more to 9.9 wt % or less, and most preferably 5.8 wt %. If the composite ratio of Co is less than 0.1 wt %, the precipitated amount of the γ' phase becomes insufficient and the strength at high temperatures cannot be maintained, thereby making this undesirable. However, the composite ratio of Co may be within the range of 0 wt % or more to less than 0.1 wt %, if necessary. Furthermore, if the composite ratio of Co exceeds 9.9 wt %, the balance with other elements such as Al, Ta, Mo, W, Hf and Cr is disturbed resulting in the precipitation of harmful phases that cause a decrease in strength at high temperatures, thereby making this undesirable.

Re improves strength at high temperatures due to solution strengthening as a result of dissolving in the matrix in the form of the γ phase. On the other hand, if a large amount of Re is added, the harmful TCP phase precipitates at high temperatures, resulting in the risk of decreased strength at high temperatures. Thus, the composite ratio of Re is preferably within the range of 3.1 wt % or more to 8.0 wt % or less, and most preferably 4.9 wt %. If the composite ratio of Re is less than 3.1 wt %, solution strengthening of the γ phase becomes insufficient and strength at high temperatures cannot be maintained at the desired level, thereby making this undesirable. If the composite ratio of Re exceeds 8.0 wt %, the TCP phase precipitates at high temperatures and strength at high temperatures cannot be maintained at a high level, thereby making this undesirable.

Ru improves strength at high temperatures by inhibiting precipitation of the TCP phase. The composite ratio of Ru is preferably within the range of 4.1 wt % or more to 14.0 wt % or less. This ratio is more preferably within the range of 10.0 wt % or more to 14.0 wt % or less, or preferably within the range of 6.5 wt % or more to 14.0 wt % or less, and most preferably 5.0 wt %, 6.0 wt % or 7.0 wt %. If the composite ratio of Ru is less than 1.0 wt %, the TCP phase precipitates at high temperatures and strength at high temperatures cannot be maintained at a high level, thereby making this undesirable. If the composite ratio of Ru is less than 4.1 wt %, strength at high temperatures decreases compared to the case when the composite ratio of Ru is 4.1 wt % or more. Furthermore, if the composite ratio of Ru exceeds 14.0 wt %, the c phase precipitates and strength at high temperatures deceases which is also undesirable.

Particularly in the present invention, by adjusting the composite ratios of Al, Ta, Mo, W, Hf Cr, Co and Ni to the optimum ratios, together with setting the aftermentioned lattice misfit and dislocation space of the alloy which are calculated from the lattice constant of the γ phase and the lattice constant of the γ' phase within their optimum ranges, strength at high temperatures is improved, and precipitation of the TCP phase can be inhibited by adding Ru. Furthermore, by adjusting the composite ratios of Al, Cr, Ta and Mo to the aforementioned ratios, the production cost for the alloy can be decreased. In addition, relative strength of the alloy can be increased and the lattice misfit and dislocation space of the alloy can be adjusted to the optimum value.

In addition, in usage environments at a high temperature from 1273 K (1000° C.) to 1373K (1100° C.), when the lattice constant of the crystals that compose the matrix in the form of the γ phase is taken to be a1, and the lattice constant of the crystals that compose the precipitation phase in the form of the γ' phase is taken to be a2, then the relationship between a1 and a2 is preferably such that a2≤0.999a1. Namely, lattice constant a2 of the crystals of the precipitation phase is preferably −0.1% or less lattice constant a1 of the crystals of the matrix. Furthermore, it is more preferable that the lattice constant of the crystals of the precipitation phase a2 is 0.9965 or less of the lattice constant of the crystals of the matrix a1. In this case, the above-described relationship between a1 and a2 becomes a2≤0.9965a1. In the following descriptions, the percentage of the lattice constant a2 relative to the lattice constant a1 is called "lattice misfit".

In addition, in the case both of the lattice constants are in the above relationship, since the precipitation phase precipitates so as to extend continuously in the direction perpendicular to the direction of the load when the precipitation phase precipitates in the matrix due to heat treatment, creep strength can be enhanced without movement of dislocation defects in the alloy structure in the presence of stress.

In order to make the relationship between lattice constant a1 and lattice constant a2 such that a2≤0.999a1, the composition of the composite elements that compose the Ni-based single crystal super alloy is suitably adjusted.

FIG. 1 shows a relationship between the lattice misfit of the alloy and the time until the alloy demonstrates creep rupture (creep rupture life).

In FIG. 1, when the lattice misfit is approximately −0.35 or lower, the creep rupture life is approximately higher than the required value (the value shown by a dotted line in a vertical axis of the figure). Therefore, in the present invention, the preferable value of the lattice misfit is determined to −0.35 or lower. In order to maintain the lattice misfit to −0.35 or lower, the composition of Mo is maintained to a high level, and the composition of the other composite elements is suitably adjusted.

According to the above Ni-based super crystal super alloy, precipitation of the TCP phase, which causes decreased creep strength, during use at high temperatures is inhibited by addition of Ru. In addition, by setting the composite ratios of other composite elements to their optimum ranges, the lattice constant of the matrix (γ phase) and the lattice constant of the precipitation phase (γ' phase) can be made to have optimum values. As a result, creep strength at high temperatures can be improved.

Ti can be further included in the above Ni-based super crystal super alloy. The composite ratio of Ti is preferably within the range of 0 wt % or more to 2.0 wt % or less. If the composite ratio of Ti exceeds 2.0 wt %, the harmful phase precipitates and the strength at high temperatures cannot be maintained, thereby making this undesirable.

Furthermore, Nb can be further included in the above Ni-based super crystal super alloy. The composite ratio of Nb is preferably within the range of 0 wt % or more to 4.0 wt % or less. If the composite ratio of Nb exceeds 4.0 wt %, the harmful phase precipitates and the strength at high temperatures cannot be maintained, thereby making this undesirable.

Alternatively, strength at high temperatures can be improved by adjusting the total composite ratio of Ta, Nb and Ti (Ta+Nb+Ti) within the range of 4.0 wt % or more to 10.0 wt % or less.

Furthermore, in addition to the unavoidable impurities, B, C, Si, Y, La, Ce, V and Zr and the like can be included in the above Ni-based super crystal super alloy, for example. When the alloy includes at least one of elements selected from B, C, Si, Y, La, Ce, V and Zr, the composite ratio of each element is preferably 0.05 wt % or less of B, 0.15 wt % or less of C, 0.1 wt % or less of Si, 0.1 wt % or less of Y, 0.1 wt % or less of La, 0.1 wt % or less of Ce, 1 wt % or less of V and 0.1 wt % or less of Zr. If the composite ratio of each element exceeds the above range, the harmful phase precipitates and the strength at high temperatures cannot be maintained, thereby making this undesirable.

Figure 2:
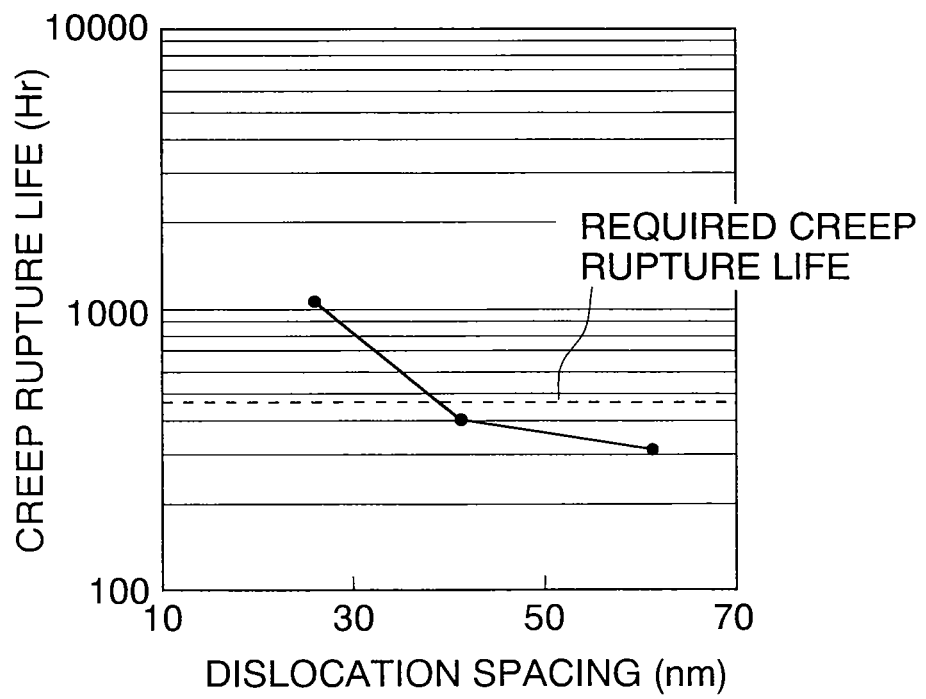
FIG. 2 is a diagram showing a relationship between dislocation space of the alloy and creep rupture life of the alloy.

Furthermore, in the above Ni-based single crystal super alloy, it is preferable that a dislocation space of the alloy is 40 nm or less. The reticulated dislocation (displacement of atoms which are connected as a line) in the alloy is called dislocation networks, and a space between adjacent reticulations is called "dislocation space". FIG. 2 shows a relationship between the dislocation space of the alloy and the time until the alloy demonstrates creep rupture (creep rupture life).

In FIG. 2, when the dislocation space is approximately 40 nm or lower, the creep rupture life is approximately higher than the required value (the value shown by a dotted line in a vertical axis of the figure). Therefore, in the present invention, the preferable value of the dislocation space is determined to 40 nm or lower. In order to maintain the dislocation space to 40 nm or lower, the composition of Mo is maintained to a high level, and the composition of the other composite elements is suitably adjusted.

Figure 3:
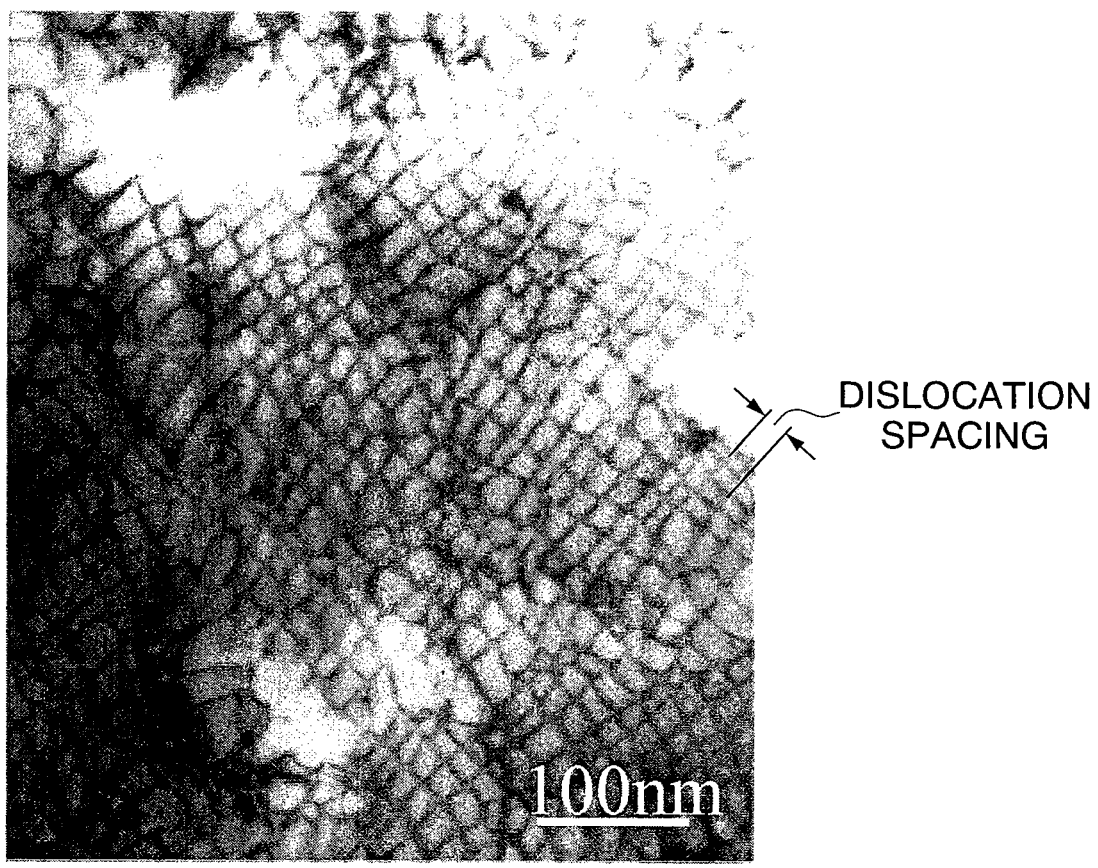
FIG. 3 is a transmission electron micrograph of the Ni-based single crystal super alloy showing an embodiment of the dislocation networks and dislocation space of the Ni-based single crystal super alloy of the present invention.

FIG. 3 is a transmission electron microgram of the Ni-based single crystal super alloy showing an embodiment (aftermentioned embodiment 3) of the dislocation networks and dislocation space of the Ni-based single crystal super alloy of the present invention. As shown in FIG. 3, in case of the Ni-based single crystal super alloy of the present invention, the dislocation space is 40 nm or lower.

In addition, some of the conventional Ni-based single crystal super alloys may cause reverse partitioning, however, in Ni-based single crystal super alloy of the present invention does not cause reverse partitioning.

The inventors of the present invention have obtained the knowledge that there is high casual relationship between the value of the lattice misfit of Ni-based heat resistant alloy and the creep rupture life thereof at high temperatures, and have investigated the relationship between the composition of the alloy and the value of the lattice misfit (Metal. Mater. Trans. A: Phys. Metal. Mater. Sci., 35 A (6), 1911 (2004), Acta Materialia, 53, 4623 (2005)).

As described above, in general, when the lattice misfit increases in negative sense, aftermentioned dislocation networks which exist in interfaces between γ and γ' phases become narrower. As a result, dislocations in the alloy are entangled during creep and stuck each other, and consequently, deformation of the alloy at high temperatures is prohibited and strength at high temperatures is improved. The value of the misfit can be obtained from the composition of the alloy by calculation as well as an actual measurement.

Embodiments

The effect of the present invention is shown using following embodiments.

Melts of various Ni-based single crystal super alloys were prepared using a vacuum melting furnace, and alloy ingots were cast using the alloy melts. The composite ratio of each of the alloy ingots (reference examples 1-6, embodiments 1-14) is shown in Table 2.

TABLE 2

| Sample (alloy name) | Elements (wt %) | | | | | | | | | | |
|---|---|---|---|---|---|---|---|---|---|---|---|
| | Al | Ta | Nb | Mo | W | Re | Hf | Cr | Co | Ru | Ni |
| Reference Example 1 | 6.0 | 5.8 | | 3.2 | 6.0 | 5.0 | 0.1 | 3.0 | 6.0 | 2.0 | Rem |
| Reference Example 2 | 5.9 | 5.7 | | 3.2 | 5.9 | 5.0 | 0.1 | 3.0 | 5.9 | 3.0 | Rem |
| Reference Example 3 | 6.0 | 6.0 | | 4.0 | 6.0 | 5.0 | 0.1 | 3.0 | 6.0 | 3.0 | Rem |
| Reference Example 4 | 5.9 | 5.9 | | 4.0 | 5.9 | 5.0 | 0.1 | 3.0 | 5.9 | 4.0 | Rem |
| Reference Example 5 | 5.9 | 5.7 | | 3.1 | 5.9 | 4.9 | 0.1 | 2.9 | 5.9 | 4.0 | Rem |
| Reference Example 6 | 5.7 | 5.7 | | 2.9 | 7.7 | 4.8 | 0.1 | 2.9 | 5.7 | 3.0 | Rem |
| Embodiment 1 | 5.9 | 5.9 | | 3.9 | 5.9 | 4.9 | 0.1 | 2.9 | 5.9 | 5.0 | Rem |
| Embodiment 2 | 5.8 | 5.6 | | 3.1 | 5.8 | 4.9 | 0.1 | 2.9 | 5.8 | 5.0 | Rem |
| Embodiment 3 | 5.8 | 5.8 | | 3.9 | 5.8 | 4.9 | 0.1 | 2.9 | 5.8 | 6.0 | Rem |
| Embodiment 4 | 5.6 | 5.6 | | 2.8 | 5.6 | 6.9 | 0.1 | 2.9 | 5.6 | 5.0 | Rem |
| Embodiment 5 | 5.6 | 5.0 | 0.5 | 2.8 | 5.6 | 6.9 | 0.1 | 2.9 | 5.6 | 5.0 | Rem |
| Embodiment 6 | 5.6 | 5.6 | 1.0 | 2.8 | 5.6 | 4.7 | 0.1 | 2.9 | 5.6 | 5.0 | Rem |
| Embodiment 7 | 5.8 | 5.6 | | 3.9 | 5.8 | 4.9 | 0.1 | 2.9 | 5.8 | 6.0 | Rem |
| Embodiment 8 | 5.7 | 5.5 | 1.0 | 3.8 | 5.7 | 4.8 | 0.1 | 2.8 | 5.5 | 5.9 | Rem |
| Embodiment 9 | 5.8 | 5.6 | | 3.1 | 6.0 | 5.0 | 0.1 | 2.9 | 5.8 | 4.6 | Rem |
| Embodiment 10 | 5.8 | 5.6 | | 3.1 | 6.0 | 5.0 | 0.1 | 2.9 | 5.8 | 5.2 | Rem |
| Embodiment 11 | 5.8 | 5.6 | | 3.3 | 6.0 | 5.0 | 0.1 | 2.9 | 5.8 | 5.2 | Rem |
| Embodiment 12 | 5.8 | 5.6 | | 3.3 | 6.0 | 5.0 | 0.1 | 2.9 | 5.8 | 6.0 | Rem |
| Embodiment 13 | 5.9 | 2.9 | 1.5 | 3.9 | 5.9 | 4.9 | 0.1 | 2.9 | 5.9 | 6.1 | Rem |
| Embodiment 14 | 5.7 | 5.52 | | 3.1 | 5.7 | 4.8 | 0.1 | 2.9 | 5.7 | 7.0 | Rem |

Next, solution treatment and aging treatment were performed on the alloy ingots followed by observation of the state of the alloy structure with a scanning electron microscope (SEM). Solution treatment consisted of holding for 1 hour at 1573K (1300° C.) followed by heating to 1613K (1340° C.) and holding for 5 hours. In addition, aging treatment consisted of consecutively performing primary aging treatment consisting of holding for 4 hours at 1273K-1423K (1000° C.-1150° C.) and secondary aging treatment consisting of holding for 20 hours at 1143K (870° C.).

As a result, a TCP phase was unable to be confirmed in the structure of each sample.

Next, a creep test was performed on each sample that underwent solution treatment and aging treatment. The creep test consisted of measuring the time until each sample (reference examples 1-6 and embodiments 1-14) demonstrated creep rupture as the sample life under each of the temperature and stress conditions shown in Table 3. Furthermore, the value of the lattice misfit of each sample was also measured, and the result thereof is disclosed in Table 3. In addition, the value of the lattice misfit of each of the conventional alloys shown in Table 1 (comparative examples 1-5) was also measured, and the result thereof is disclosed in Table 4.

TABLE 3

| Sample (alloy name) | Creep test conditions/rupture life (h) | | Lattice Misfit |
|---|---|---|---|
| | 1273K (1000° C.) 245 Mpa | 1373K (1100° C.) 137 MPa | |
| Reference Example 1 | 209.35 | 105.67 | −0.39 |
| Reference Example 2 | 283.20 | 158.75 | −0.40 |
| Reference Example 3 | 219.37 | 135.85 | −0.56 |
| Reference Example 4 | 274.38 | 153.15 | −0.58 |
| Reference Example 5 | 328.00 | 487.75 | −0.58 |
| Reference Example 6 | | 203.15 | −0.41 |
| Embodiment 1 | 509.95 | 323.50 | −0.60 |
| Embodiment 2 | 420.60 | 753.95 | −0.42 |
| Embodiment 3 | | 1062.50 | −0.62 |
| Embodiment 4 | | 966.00 | −0.44 |
| Embodiment 5 | | 1256.00 | −0.48 |
| Embodiment 6 | | 400.00 | −0.45 |
| Embodiment 7 | | 1254.00 | −0.60 |
| Embodiment 8 | | 682.00 | −0.63 |
| Embodiment 9 | | 550.00 | −0.42 |
| Embodiment 10 | | 658.50 | −0.45 |
| Embodiment 11 | | 622.00 | −0.48 |
| Embodiment 12 | | 683.50 | −0.51 |
| Embodiment 13 | 412.7 | 766.35 | −0.62 |
| Embodiment 14 | | 1524.00 | −0.45 |

TABLE 4

| Sample (alloy name) | Lattice Misfit |
|---|---|
| Comparative Example 1 (CMSX-2) | −0.26 |
| Comparative Example 2 (CMSX-4) | −0.14 |
| Comparative Example 3 (Rene'N6) | −0.22 |
| Comparative Example 4 (CMSX-10K) | −0.14 |
| Comparative Example 5 (3B) | −0.25 |

As is clear from Table 3, the samples of the reference examples 1-6 and embodiments 1-14 were determined to have high strength even under high temperature conditions of 1273K (1000° C.). In particular, reference example 5 having a composition of 4.0 wt % of Ru, embodiments 1, 2, 4, 9, and 11 having a composition approximately 5.0 wt % of Ru, embodiments 3, 12 and 13 having a composition of 6.0 wt % of Ru, and embodiment 14 having a composition of 7.0 wt % of Ru, were determined to have high strength at high temperature.

Furthermore, as is clear from Tables 3 and 4, the lattice misfit of comparative examples were −0.35 and more, whereas those of reference examples 1-6 and embodiments 1-14 were −0.35 or less.

In addition, the creep rupture characteristics (withstand temperature) were compared for the alloys of the prior art shown in Table 1 (Comparative Examples 1 through 5) and the sample shown in Table 2 (reference examples 1-6 and embodiments 1-14). The result thereof is disclosed in Table 5. Creep rupture characteristics were determined either as a result of measuring the temperature until the sample ruptured under conditions of applying stress of 137 MPa for 1000 hours, or converting the rupture temperature of the sample under those conditions.

TABLE 5

| Sample (alloy name) | Withstand temperature (° C.) |
|---|---|
| Reference Example 1 | 1315K (1042° C.) |
| Reference Example 2 | 1325K (1052° C.) |
| Reference Example 3 | 1321K (1048° C.) |
| Reference Example 4 | 1324K (1051° C.) |
| Reference Example 5 | 1354K (1081° C.) |
| Reference Example 6 | 1332K (1059° C.) |
| Embodiment 1 | 1344K (1071° C.) |
| Embodiment 2 | 1366K (1093° C.) |
| Embodiment 3 | 1375K (1102 C.) |
| Embodiment 4 | 1372K (1099° C.) |
| Embodiment 5 | 1379K (1106° C.) |
| Embodiment 6 | 1379K (1106° C.) |
| Embodiment 7 | 1349K (1076° C.) |
| Embodiment 8 | 1363K (1090° C.) |
| Embodiment 9 | 1358K (1085° C.) |
| Embodiment 10 | 1362K (1089° C.) |
| Embodiment 11 | 1361K (1088° C.) |
| Embodiment 12 | 1363K (1090° C.) |
| Embodiment 13 | 1366K (1093° C.) |
| Embodiment 14 | 1384K (1111° C.) |
| Comparative Example 1 (CMSX-2) | 1289K (1016° C.) |
| Comparative Example 2 (CMSX-4) | 1306K (1033° C.) |
| Comparative Example 3 (Rene'N6) | 1320K (1047° C.) |
| Comparative Example 4 (CMSX-10K) | 1345K (1072° C.) |
| Comparative Example 5 (3B) | 1353K (1080° C.) |

(Converted to 137 MPa, 1000 hours)

As is clear from Table 5, the samples of reference examples 1-6 and embodiments 1-14 were determined to have a high withstand temperature (1356K (1083° C.)) equal to or greater than the alloys of the prior art (comparative Examples 1-5). In particular, samples of reference examples 1-6 and embodiments 1-14 were determined to have a high withstand temperature (embodiment 1: 1344K (1071° C.), embodiment 2: 1366K (1093° C.), embodiment 3: 1375K (1102° C.), embodiment 4: 1372K (1099° C.), embodiment 5: 1379K (1106° C.), embodiment 6: 1379K (1106° C.), embodiment 7: 1349K (1076° C.), embodiment 8: 1363K (1090° C.), embodiment 9: 1358K (1085° C.), embodiment 10: 1362K (1089° C.), embodiment 11: 1361K (1088° C.), embodiment 12: 1363K (1090° C.), embodiment 13: 1366K (1093° C.) and embodiment 14: 1384K (1111° C.)).

Thus, this alloy has a higher heat resistance temperature than Ni-based single crystal super alloys of the prior art, and was determined to have high strength even at high temperatures.

Furthermore, in the Ni-based single crystal super alloy, if the composite ratio of Ru excessively increases, the E phase precipitates and strength at high temperatures decreases. Therefore, the composite ratio of Ru is preferably be determined to a range so as to keep the balance against the composition of the other composite elements is suitably adjusted (4.1 wt % or more to 14.0 wt % or less, for example).

What is claimed is:

1. An Ni-based single crystal super alloy having a composition comprising 5.8 wt % of Al, 5.8 wt % of Ta, 3.9 wt % of Mo, 5.8 wt % of W, 4.9 wt % of Re, 0.10 wt % of Hf, 2.9 wt % of Cr, 5.8 wt % of Co and 6.0 wt % of Ru in terms of weight ratio, with the remainder consisting of Ni and unavoidable impurities; and wherein when lattice constant of matrix is taken to be a1 and lattice constant of precipitation phase is taken to be a2, a2≤0.9965a1.

2. An Ni-based single crystal super alloy having a composition comprising 5.6 wt % of Al, 5.6 wt % of Ta, 2.8 wt % of Mo, 5.6 wt % of W, 6.9 wt % of Re, 0.10 wt % of Hf, 2.9 wt % of Cr, 5.6 wt % of Co and 5.0 wt % of Ru in terms of its weight ratio, with the remainder consisting of Ni and unavoidable impurities; and wherein when lattice constant of matrix is taken to be a1 and lattice constant of precipitation phase is taken to be a2, a2≤0.9965a1.

3. An Ni-based single crystal super alloy having a composition comprising 5.6 wt % of Al, 5.0 wt % of Ta, 0.5 wt % of Nb, 2.8 wt % of Mo, 5.6 wt % of W, 6.9 wt % of Re, 0.10 wt % of Hf, 2.9 wt % of Cr, 5.6 wt % of Co and 5.0 wt % of Ru in terms of its weight ratio, with the remainder consisting of Ni and unavoidable impurities; and wherein when lattice constant of matrix is taken to be a1 and lattice constant of precipitation phase is taken to be a2, a2≤0.9965a1.

4. An Ni-based single crystal super alloy having a composition comprising 5.6 wt % of Al, 5.6 wt % of Ta, 1.0 wt % of Nb, 2.8 wt % of Mo, 5.6 wt % of W, 4.7 wt % of Re, 0.10 wt % of Hf, 2.9 wt % of Cr, 5.6 wt % of Co and 5.0 wt % of Ru in terms of its weight ratio, with the remainder consisting of Ni and unavoidable impurities; and wherein when lattice constant of matrix is taken to be a1 and lattice constant of precipitation phase is taken to be a2, a2≤0.9965a1.

5. An Ni-based single crystal super alloy having a composition comprising 5.8 wt % of Al, 5.6 wt % of Ta, 3.9 wt % of Mo, 5.8 wt % of W, 4.9 wt % of Re, 0.10 wt % of Hf, 2.9 wt % of Cr, 5.8 wt % of Co and 6.0 wt % of Ru in terms of its weight ratio, with the remainder consisting of Ni and unavoidable impurities; and wherein when lattice constant of matrix is taken to be a1 and lattice constant of precipitation phase is taken to be a2, a2≤0.9965a1.

6. An Ni-based single crystal super alloy having a composition comprising 5.7 wt % of Al, 5.52 wt % of Ta, 3.1 wt % of Mo, 5.7 wt % of W, 4.8 wt % of Re, 0.10 wt % of Hf, 2.9 wt % of Cr, 5.7 wt % of Co and 7.0 wt % of Ru in terms of its weight ratio, with the remainder consisting of Ni and unavoidable impurities; and wherein when lattice constant of matrix is taken to be a1 and lattice constant of precipitation phase is taken to be a2, a2≤0.9965a1.

7. An Ni-based single crystal super alloy according to claim 1 wherein a dislocation space of the alloy is 40 nm or less.

8. An Ni-based single crystal super alloy according to claim 2 wherein a dislocation space of the alloy is 40 nm or less.

9. An Ni-based single crystal super alloy according to claim 3 wherein a dislocation space of the alloy is 40 nm or less.

10. An Ni-based single crystal super alloy according to claim 4 wherein a dislocation space of the alloy is 40 nm or less.

11. An Ni-based single crystal super alloy according to claim 5 wherein a dislocation space of the alloy is 40 nm or less.

12. An Ni-based single crystal super alloy according to claim 6 wherein a dislocation space of the alloy is 40 nm or less.

* * * * *